United States Patent [19]

Linn

[11] Patent Number: 5,526,768
[45] Date of Patent: Jun. 18, 1996

[54] METHOD FOR PROVIDING A SILICON AND DIAMOND SUBSTRATE HAVING A CARBON TO SILICON TRANSITION LAYER AND APPARATUS THEREOF

[75] Inventor: Jack H. Linn, Melbourne, Fla.

[73] Assignee: Harris Corporation, Melbourne, Fla.

[21] Appl. No.: 190,998

[22] Filed: Feb. 3, 1994

[51] Int. Cl.⁶ .................................................. C30B 29/04
[52] U.S. Cl. .............................. 117/89; 117/929; 423/446
[58] Field of Search ................................. 423/446, 345; 428/577; 437/128; 117/929, 89

[56] References Cited

U.S. PATENT DOCUMENTS

| | | | |
|---|---|---|---|
| 3,617,347 | 11/1971 | Kuratomi . | |
| 4,241,135 | 12/1980 | Lee et al. | 428/332 |
| 4,704,339 | 11/1987 | Green et al. | 428/689 |
| 4,962,062 | 10/1990 | Uchiyama et al. . | |
| 5,164,220 | 11/1992 | Caballero | 427/577 |
| 5,266,135 | 11/1993 | Short et al. | 156/87 |
| 5,272,104 | 12/1993 | Schrantz et al. | 437/63 |
| 5,362,667 | 11/1994 | Linn et al. | 437/62 |
| 5,387,555 | 2/1995 | Linn et al. | 437/225 |
| 5,392,982 | 2/1995 | Li | 228/124.5 |

FOREIGN PATENT DOCUMENTS

| | | |
|---|---|---|
| 03150360 | 6/1991 | Japan . |
| 04132692 | 5/1992 | Japan . |

OTHER PUBLICATIONS

Jones, et al., Abstract No. 478, *J. Electrom. Soc.*, vol. 138, No. 8, Aug. 1991.

*Primary Examiner*—Robert Kunemund
*Attorney, Agent, or Firm*—Nixon, Hargrave, Devans & Doyle

[57] ABSTRACT

A method for bonding CVD diamond to silicon. The first step of the method involves subsequently depositing a transition lawyer 48 on a diamond layer 46 of a composite wafer 40. Once the transition layer 48 has been deposited, wafer layer 50 comprised of silicon, is bonded or deposited to the transition layer 48. In this method, the transition layer 48 comprises carbon and silicon, with the portion of the transition layer 48 adjacent the diamond layer 46 being comprised of substantially carbon and the portion of the transition layer 48 adjacent the wafer layer 50 being comprised of substantially silicon. With the method, sharp interfaces and poor thermal matches between the layers in the composite wafer can be minimized. As a result, the layers in the composite wafer are less likely to delaminate and the composite wafer is likely to warp or bow due to mismatched film stresses. Another advantage is that the method can be carried out as one continuous process avoiding the added manufacturing costs often associated with prior methods which require these composite wafers to be constructed by two or more separate processing steps. Additionally, the diamond layer 46 can be protected from ambient temperature during high temperature processes involving other layers by the transition layer 48.

12 Claims, 10 Drawing Sheets

5,526,768

METHOD FOR PROVIDING A SILICON AND DIAMOND SUBSTRATE HAVING A CARBON TO SILICON TRANSITION LAYER AND APPARATUS THEREOF

FIELD OF THE INVENTION

This invention relates to a method for providing a silicon on diamond substrate, more particularly, to a method for bonding a wafer to a poly-silicon layer, which is co-deposited on a transitional layer of carbon and silicon, which is co-deposited on a diamond layer.

BACKGROUND OF THE INVENTION

Referring to FIGS. 1(a)–1(d), one known method of bonding a layer of diamond to a silicon wafer to produce a diamond on silicon structure is shown. The method starts with a composite wafer 10 having a layer of CVD diamond 12 deposited on a layer of epitaxially grown silicon 14 on a device wafer layer 16, as illustrated in FIG. 1(a). Next a layer of poly-silicon 18 is deposited on the CVD diamond layer 12, as shown in FIG. 1(b). Once the layer of poly-silicon 18 is deposited, a bonding layer 20 is formed when the poly-silicon layer 18 and a handle wafer layer 22 are bonded together, as shown in FIG. 1(c). This layer bonding is accomplished through well known wafer bonding methods, such as the methods disclosed in U.S. patent application Ser. No. 07/921,197, filed Jul. 28, 1992, assigned to the assignee of the present invention and incorporated herein by reference, U.S. patent application Ser. No. 07/939,786, filed Sep. 3, 1992, assigned to the assignee of the present invention and incorporated herein by reference, and U.S. patent application Ser. No. 08/029,860, filed Mar. 11, 1993, assigned to the assignee of the present invention and incorporated herein by reference. Finally, the composite wafer 10 is flipped over and the device wafer layer 16 is thinned, as shown in FIG. 1(d).

The method described in FIGS. 1(a)–1(d) has several problems. The epitaxially grown silicon layer 14 is exposed to the diamond deposition and the poly-silicon deposition which can damage the silicon layer 14, as well as affect the distribution of intended dopants, such as boron and phosphorous, in the silicon layer 14. Additionally, there is a sharp interface between the diamond layer 12 and the poly-silicon layer 18 which results in only limited chemical bonding and, therefore, poor adhesion between diamond layer 12 and poly-silicon layer 18. This can increase the likelihood of film delamination and stress between the two layers. There is also a poor thermal match between the thermal coefficients of expansion for diamond layer 12 and the poly-silicon layer 18. This abrupt compositional change can result in warpage of the composite wafer 10 at elevated processing temperatures due to mismatched expansion and contraction of the layers. Further, the steps in forming the composite wafer 10 cannot be completed in one continuous process, as the poly-silicon layer is deposited separately from the diamond layer. This requires separate processing steps which adds to the manufacturing costs.

Referring to FIGS. 2(a)–2(h), another known method of bonding a layer of diamond to a silicon wafer to produce a silicon on diamond structure is shown. The method begins with a composite wafer 24 having a diamond layer 26 deposited on a substrate wafer layer 28, as shown in FIG. 2(a). Next a first poly-silicon layer 30 is deposited on the diamond layer 26, as shown in FIG. 2(b). Once the layer of poly-silicon 30 is deposited, a bonding layer 32 is formed when the poly-silicon layer 30 and a silicon handle wafer layer 34 are bonded together, as shown in FIG. 2(c). This wafer bonding is accomplished through well known wafer bonding methods, such as the methods disclosed in U.S. patent application Ser. No. 07/921,197, filed Jul. 28, 1992, assigned to the assignee of the present invention and incorporated herein by reference, U.S. patent application Ser. No. 07/939,786, filed Sep. 3, 1992, assigned to the assignee of the present invention and incorporated herein by reference, and U.S. patent application Ser. No. 08/029,860, filed Mar. 11, 1993, assigned to the assignee of the present invention and incorporated herein by reference. In the next step, the substrate wafer layer 28 is removed from the CVD diamond layer 26, as shown in FIG. 2(d) and the composite wafer 24 is flipped-over, as shown in FIG. 2(e). A second poly-silicon layer 36 is deposited on the CVD diamond layer 26 as shown in FIG. 2(f). A bonding layer 39 is formed between device wafer layer 38 and poly-silicon layer 36 when device wafer 38 is bonded to poly-silicon layer 36, as shown in FIG. 2(g). This wafer bonding is again accomplished through well known wafer bonding methods, such as the methods disclosed in U.S. patent application Ser. No. 07/921,197, filed Jul. 28, 1992, assigned to the assignee of the present invention and incorporated herein by reference, U.S. patent application Ser. No. 07/939,786, filed Sep. 3, 1992, assigned to the assignee of the present invention and incorporated herein by reference, and U.S. patent application Ser. No. 08/029,860, filed Mar. 11, 1993, assigned to the assignee of the present invention and incorporated herein by reference. Finally, the remaining first poly-silicon layer 30, bonding layer 32 and handle wafer layer 34 are removed from the CVD diamond layer 26, as shown in FIG. 2(h). Device wafer 38 can then be thinned to the appropriate thickness.

The method shown in FIGS. 2(a)–2(h) has the same problems as those discussed above for the method shown in FIGS. 1(a)–1(d). Additionally, with this method the diamond layer backside can be damaged from exposure to high ambient temperatures during high temperature processing. The prior art methods and techniques thus require bonding the diamond layer or composite diamond and silicon structure to substrate and handle wafers in order to form diamond on silicon wafers and devices.

It is a general object of the present invention to provide an improved method for bonding layers.

It is another object of the present invention to provide an improved method for depositing poly-silicon on diamond.

It is another object to provide one or more reliable transition layers for bonding CVD diamond on silicon wafers to substrate and handling wafers.

SUMMARY OF THE INVENTION

According to the present invention, these and other objects and advantages are achieved in a method for bonding layers and a resulting apparatus thereof. In this method, a first transition layer is deposited on a diamond layer of a composite wafer. Once the first transition layer has been deposited, a wafer layer comprising silicon is bonded to the first transition layer. The first transition layer comprises carbon and silicon and the portion of the first transition layer adjacent the diamond layer comprises substantially carbon and the portion of the first transition layer adjacent to the wafer layer comprises substantially silicon. Preferably with this method, the amount of carbon in the first transition layer is at a maximum at the region adjacent the diamond layer and is at a minimum at the region adjacent the wafer layer, while the amount of silicon in the first transition layer is at a maximum at the region adjacent the to the wafer layer and is at a minimum at the region adjacent to the diamond layer. Additionally, the amount of carbon in the first transition layer is inversely proportional to the distance from the diamond layer and the amount of silicon in the first transition layer is inversely proportional to the distance from wafer layer. Although only one transition layer is discussed above, with this method multiple transition layers can be deposited on a composite wafer. For example, with a first and second transition layers, a device wafer and a handle wafer can be bonded to opposing sides of a diamond layer with all of the attendant advantages of this invention.

The method for bonding layers and resulting apparatus thereof described above have several advantages. With the transition layer, the interfaces between the lattice structures of the layers which the transition layer bonds together are not sharp, permitting better bonding between the layers and, thus, reducing the chances of delamination. Additionally with the transition layer, the film stresses resulting from the mismatched thermal coefficients of expansion are minimized due to the bonding gradient in the transition layer, which also helps reduce the chance of delamination, damage due to cracking, and composite wafer warpage at elevated processing temperatures. Another advantage is that the method can be carried out as one continuous process avoiding the added manufacturing costs often associated with prior methods which require these composite wafers to be constructed by two or more separate processes. Further, with this method the backside of the diamond layer can be protected from ambient temperatures during high temperature processing of the composite wafer.

BRIEF DESCRIPTION OF THE DRAWINGS

For a better understanding of the present invention, together with other and further objects, advantages and capabilities thereof, references made to the accompanying drawings, which are incorporated herein by reference and in which.

DETAILED DESCRIPTION

A method and resulting apparatus thereof in accordance with the present invention is illustrated in three embodiments shown in FIGS. 3–5. Those skilled in the art will appreciate that there are numerous steps in the fabrication of composite wafers. As such, the steps in the methods illustrated in FIGS. 3–5 are for purposes of illustrating the invention only. Basically, the method includes the steps of providing a first layer comprised of one or more first elements, depositing a transition layer on the first layer, and then bonding a second layer comprised of one or more second elements on the transition layer. The transition layer being comprised of the first and second elements. The portion of the transition layer adjacent the first layer being comprised of substantially one or more first elements and the portion of the transition layer adjacent the second layer being comprised of substantially one or more second elements.

Figure 1A:
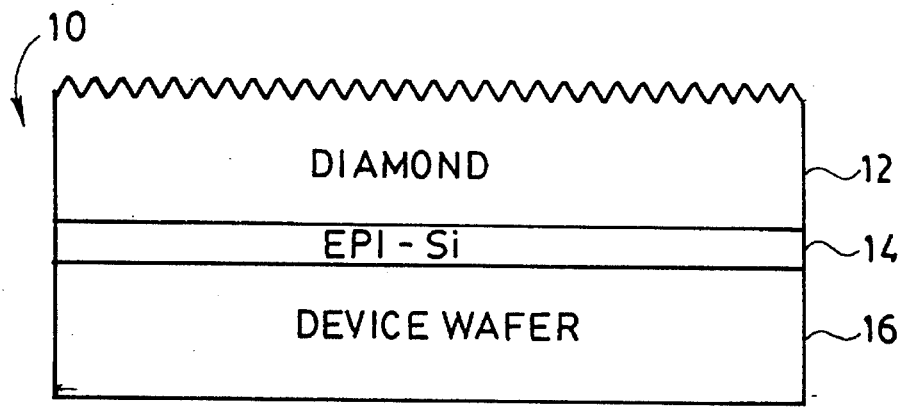
FIG. 1(a) is a schematic diagram of a composite wafer during a first step of one prior art method of bonding layers.
Figure 1B:
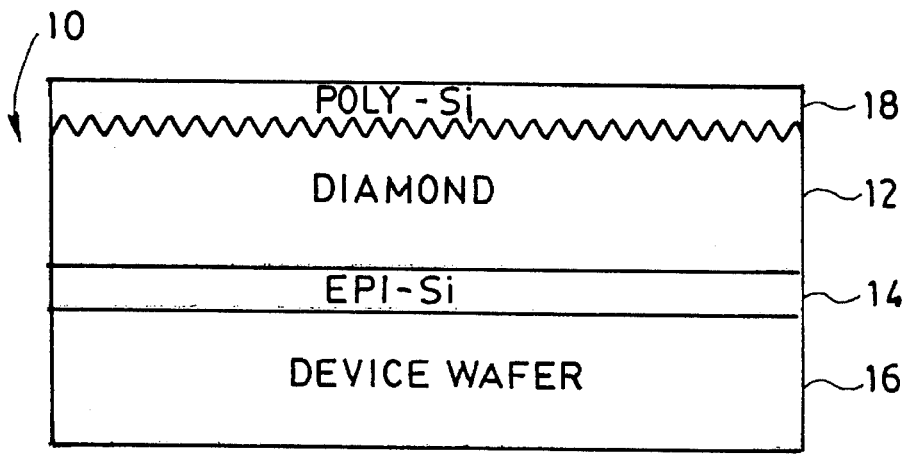
FIG. 1(b) is a schematic diagram of the composite wafer during a second step of the one prior art method.
Figure 1C:
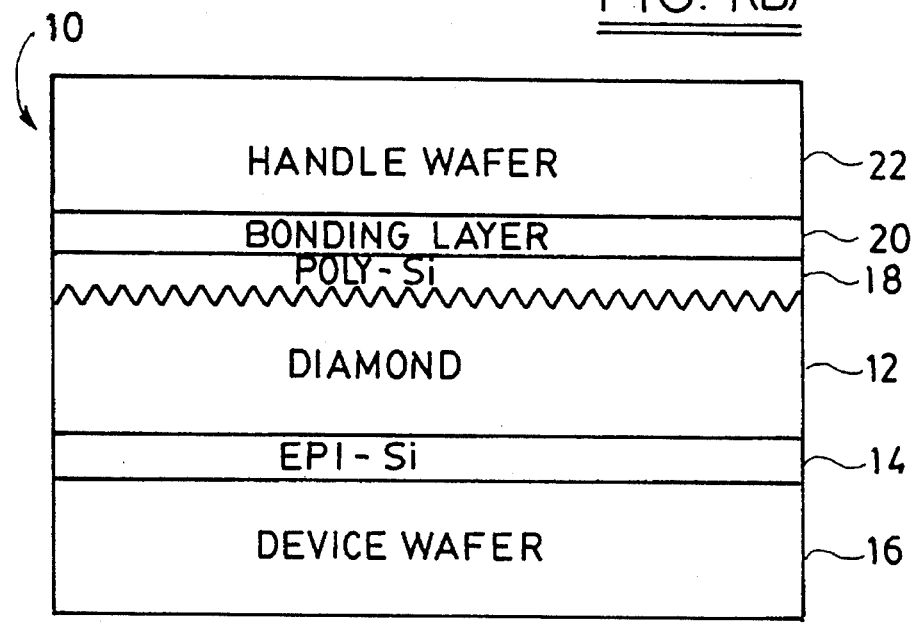
FIG. 1(c) is a schematic diagram of the composite wafer during a third step of the one prior art method.
Figure 1D:
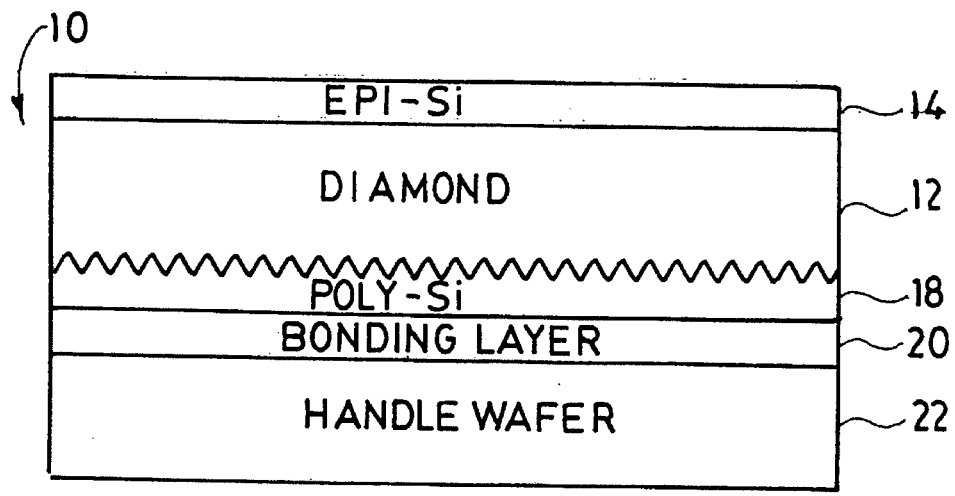
FIG. 1(d) is a schematic diagram of the composite wafer during a fourth step of the one prior art method.
Figure 2A:
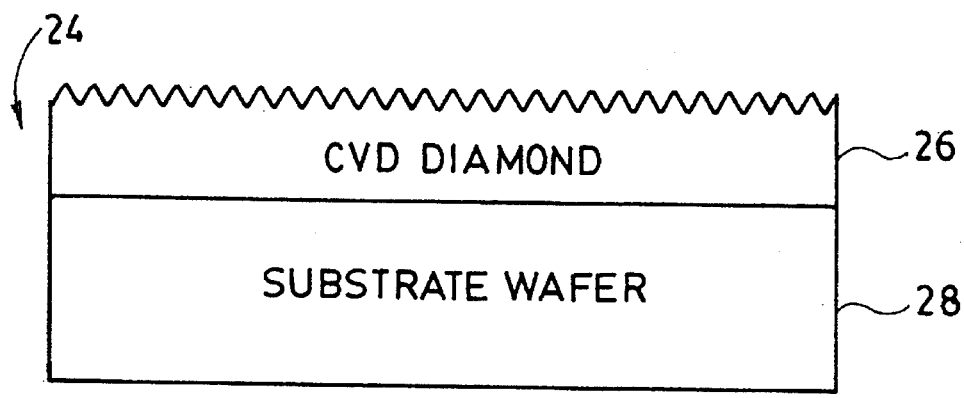
FIG. 2(a) is a schematic diagram of a composite wafer during a first step of a second prior art method of bonding layers.
Figure 2B:
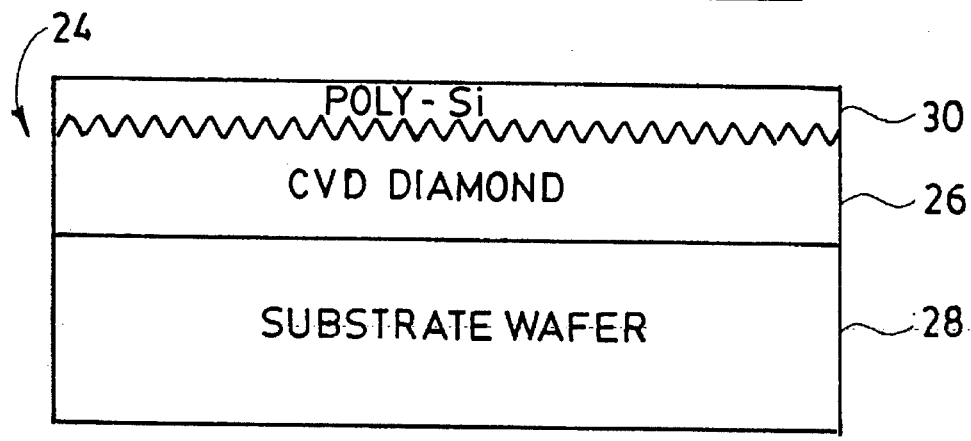
FIG. 2(b) is a schematic diagram of the composite wafer during a second step of the second prior art method.
Figure 2C:
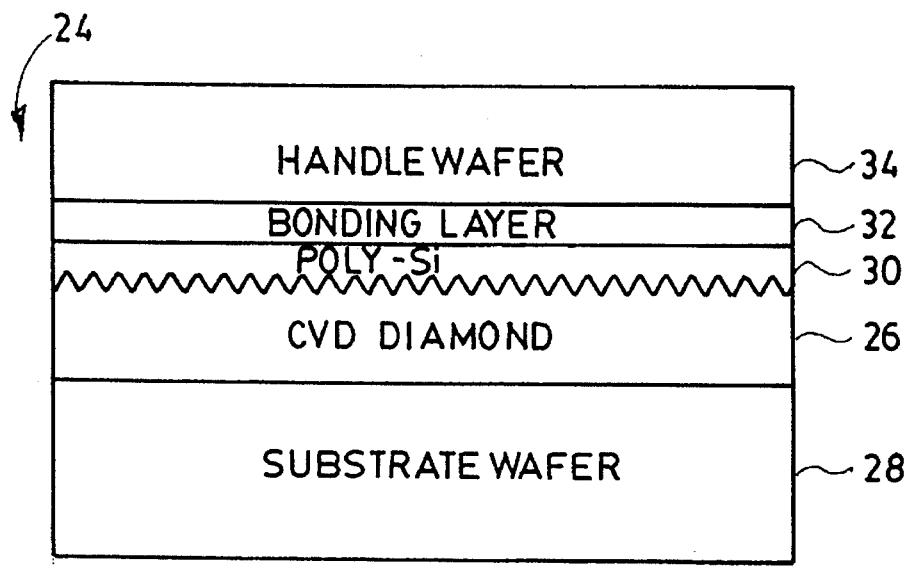
FIG. 2(c) is a schematic diagram of the composite wafer during a third step of the second prior art method.
Figure 2D:
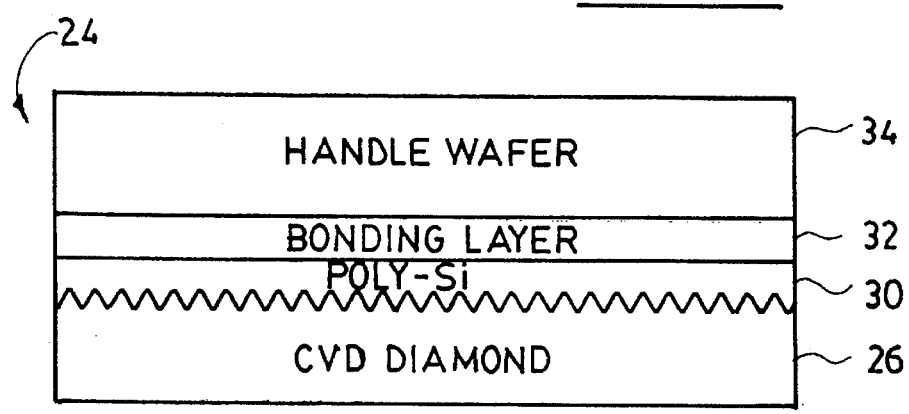
FIG. 2(d) is a schematic diagram of the composite wafer during a fourth step of the second prior art method.
Figure 2E:
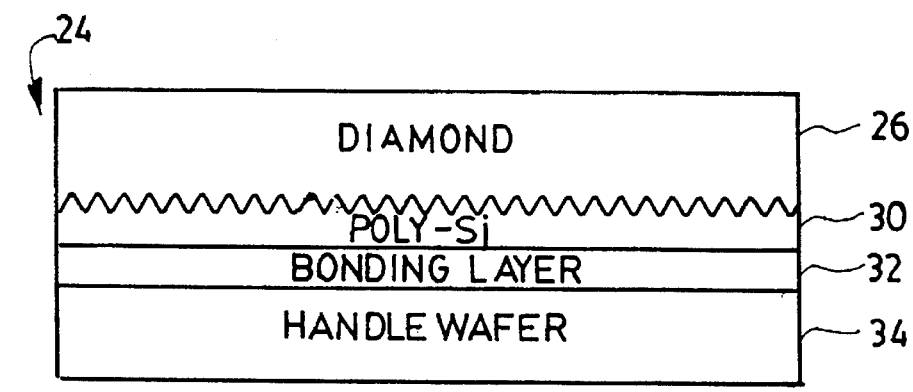
FIG. 2(e) is a schematic diagram of the composite wafer during a fifth step of the method.
Figure 2F:
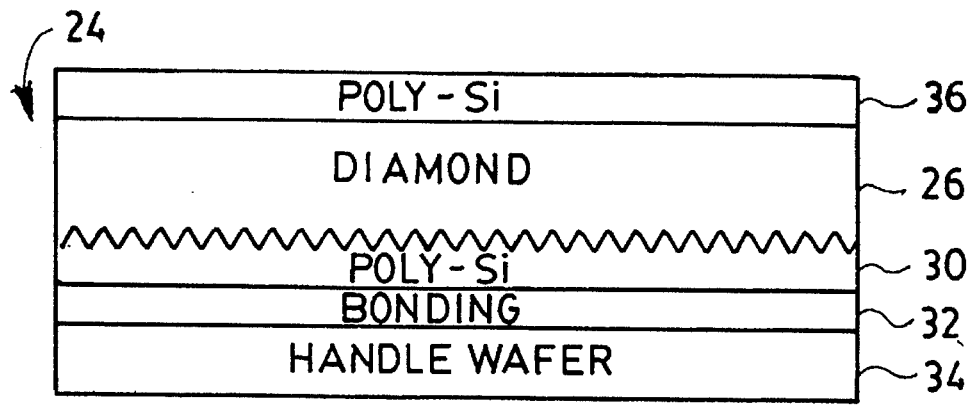
FIG. 2(f) is a schematic diagram of the composite wafer during a sixth step of the second prior art method.
Figure 2G:
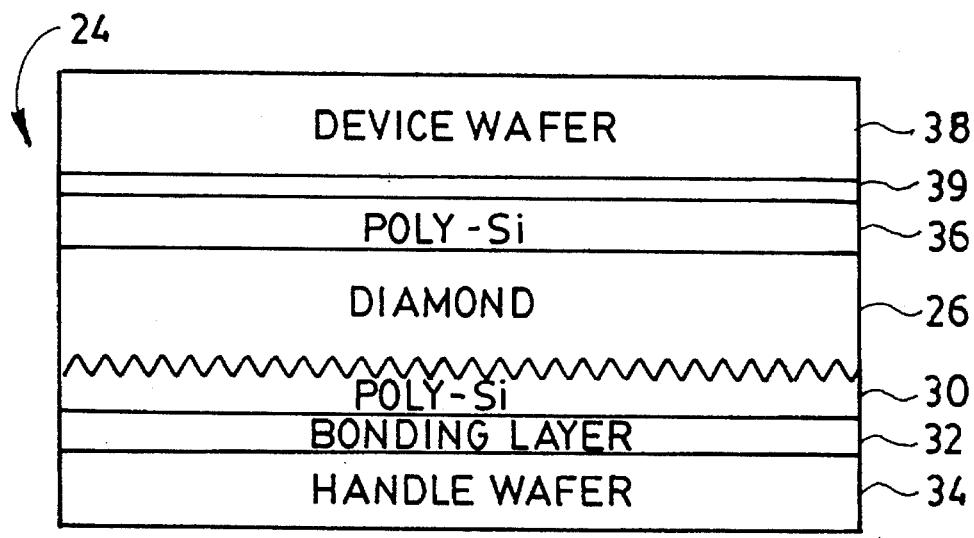
FIG. 2(g) is a schematic diagram of the composite wafer during a seventh step of the second prior art method.
Figure 2H:
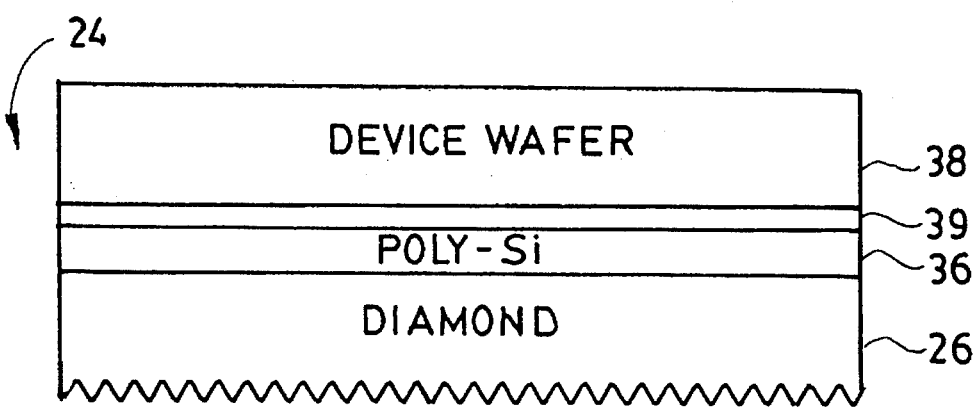
FIG. 2(h) is a schematic diagram of the composite wafer during an eighth step of the second prior art method.
Figure 3A:
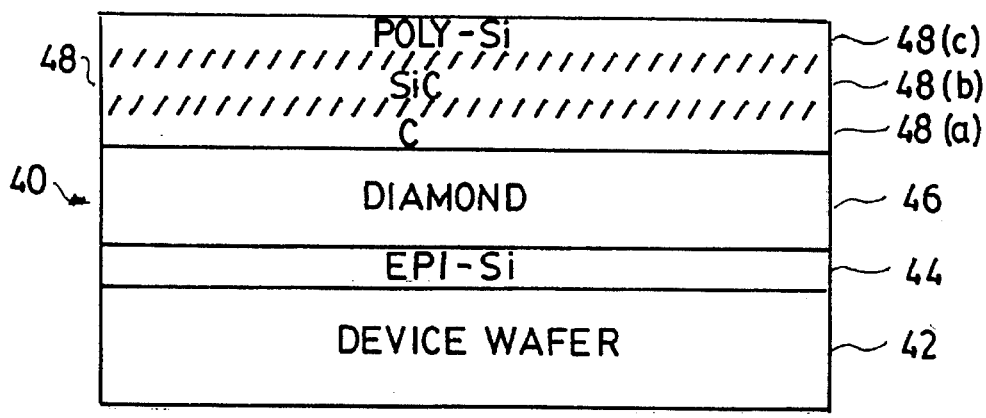
FIG. 3(a) is a schematic diagram of a composite wafer during a first step of a first method in accordance with the present invention, which uses a single transition layer.
Figure 3B:
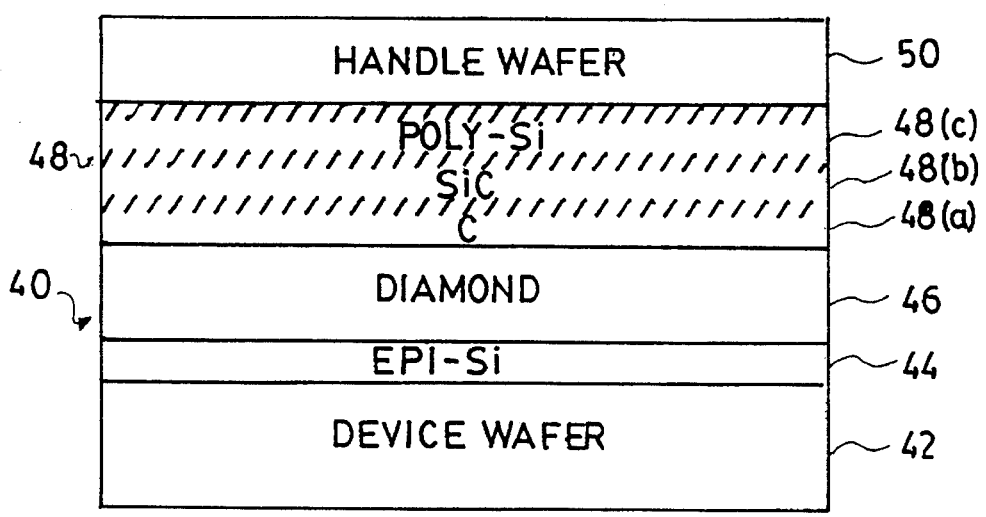
FIG. 3(b) is a schematic diagram of the composite wafer during a second step of the first method.
Figure 3C:
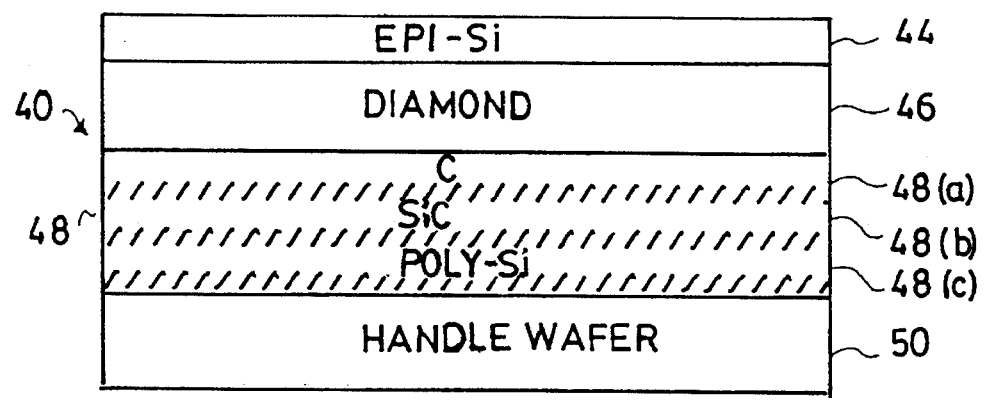
FIG. 3(c) is a schematic diagram of the composite wafer during a third step of the first method.

Referring to FIGS. 3(a)–3(c), one method of bonding layers and the resulting apparatus in accordance with the present invention is shown. In FIG. 3(a), a composite wafer 40 has a device wafer layer 42 with a layer of epitaxially grown silicon 44, which is grown by well known methods to those skilled in the art. A layer of diamond 46 is deposited on the epitaxially grown silicon layer 44 and a transition layer 48 is deposited on the diamond layer 46. Although in this particular embodiment a layer of silicon 44 is grown on the device wafer layer 42 and the transition layer 48 has a composition comprising silicon and carbon, other layers could be grown on the device wafer 42 and the transition layer 48 could be comprised of other elements, such as germanium and carbon.

In this particular embodiment, the transition layer 48 is shown broken down into three regions 48(*a*)–48(*c*). In region 48(*a*) the transition layer 48 has a composition comprised primarily of carbon (pseudo-diamond), in region 48(*b*) the transition layer 48 has a composition comprised of silicon and carbon, and in region 48(*c*) the transition layer 48 has a composition comprised of primarily silicon. Preferably, there is a relatively smooth graded transition in the composition of the transition layer 48 between the regions 48(*a*)–48(*c*).

At the start of this method in this particular embodiment, the transition layer 48 is deposited on the diamond layer 46 as a composition comprised of almost entirely carbon. Preferably at the start of deposition, the transition layer 48 has a composition of 100% carbon and 0% silicon. As the deposition of the transition layer 48 continues, the composition of the transition layer 48 is changed by increasing the amount of silicon and decreasing the amount of carbon. Preferably, the ratio of carbon to silicon atoms is changed by 10 percent every 1000 angstroms. Eventually during the deposition of the transition layer 48, the transition layer 48 has a composition comprised almost entirely of silicon. The thickness of the resulting transition layer 48, as well as the ratio of carbon to silicon atoms, can vary as desired. In this particular embodiment, the transition layer 48 has a thickness between 2000 and 20,000 angstroms. Those skilled in the art would appreciate that the step of depositing the transition layer 48 could involve other layers and elements. For example, the diamond layer 46 could be replaced by a wafer layer having a composition comprised of silicon and as a result a transition layer comprised of almost entirely silicon would be deposited at the start of the method and changed to a mixture of silicon and carbon and then carbon. Thus, a diamond layer 46 could be co-deposited on the mostly carbon surface of the transition layer 48.

A transition layer 48, having a composition comprised of silicon and carbon in this particular embodiment, can be deposited on the diamond layer 46 using one of a number of well known techniques in the art, such as chemical vapor deposition (CVD). In this particular embodiment, the transition layer 48 is subsequently deposited on the diamond layer in the CVD deposition chamber (not shown) by first reacting methane gas with hydrogen gas. Preferably, a ratio of 10% methane gas and 90% hydrogen gas is used for the deposition of the transition layer, although the percentages and the gases could be changed. Once the deposition of the transition layer is begun, silane gas is slowly added to the flow of methane and hydrogen gas. The flow of methane gas is gradually decreased and the flow of silane gas is gradually increased. Eventually, there is only a flow of silane and hydrogen gas present in the deposition chamber. The rate at which silane gas is introduced and methane gas is decreased will control the composition of the deposited transition layer 48. In this particular embodiment, the flow of silane gas is increased at a rate of 2% per minute and the flow of methane gas and hydrogen gas is decreased at a rate of 1% per minute. Other flow rates are also possible to provide different film composition, thickness, and stress. Preferably, the deposition chamber is kept at an operating temperature between 600 and 1000 degrees C., although other temperature ranges could be used. Although methane, hydrogen, and silane gases are used in this embodiment other gases could be used depending upon the desired composition of the transition layer 48.

Once the transition layer 48 has been deposited as described above, a handle wafer layer 50 is bonded on the transition layer 48, as shown in FIG. 3(*b*). Techniques for bonding a monocrystalline surface with a polycrystalline silicon surface are known. See Jones;, et al., Abstract No. 478, J. Electrom. Soc., Vol. 138, No. 8, Aug. 1991. Bonding should be preceded by a pre-bond surface treatment consisting of, for example, an $H_2SO_4\backslash H_2O_2$ cleaning followed by a second cleaning with $NH_4OH$ and a spin rinse/dry. Enhanced bonding between the wafer layer 50 and the transition layer 48 may be had by formation of oxide at the interface. For example, inclusion of a liquid oxidant, such as hydrogen peroxide, in a high temperature anneal, e.g., above 900 C., in a neutral ambient environment for several hours results in an oxygen bond between lattice silicon and polycrystalline silicon. For further details see U.S. Pat. No. 4,962,062 issued Oct. 09, 1990 and incorporated herein by reference. See, also, U.S. patent application Ser. No. 07/834, 439, continuation of Ser. No. 476,322, filed Feb. 7, 1990, assigned to the assignee of the present invention and incorporated herein by reference, disclosing a preferred liquid oxidant for enhancing bonded wafer yield, such as the methods disclosed in U.S. patent application Ser. No. 07/921,197, filed Jul. 28, 1992, assigned to the assignee of the present invention and incorporated herein by reference and U.S. patent application Ser. No. 07/939,786, filed Sep. 3, 1992, assigned to the assignee of the present invention and incorporated herein by reference.

If it is desirable to bond the transition layer 48 to the layer 18 without retaining a residual intervening oxide layer, then such bonding may be accomplished by growing the layer 18 by the float-zone (FZ) method and allowing only native oxide on the surface of the transition 50 and the wafer. The surfaces are placed in contact with one another and the structure is annealed at a high temperature. The native oxide will dissolve into the layer during the anneal because silicon has an extremely low oxygen content. This method of bonding may be desirable when devices are to be fabricated on the side of the bonded structure containing the transition layer 48.

In this particular embodiment, the handle wafer layer 50 is comprised of silicon, although the handle wafer layer 50 could be comprised of other materials, such as germanium. Finally, the composite wafer 40 can be flipped over and the device wafer layer 42 thinned from the epitaxially grown silicon layer 44 by well known methods in the art, as shown in FIG. 3(*c*).

The above-described method and the resulting apparatus have several advantages. The lattice structures of the diamond layer 46 and the transition layer 48 at the point of intersection are closely, if not identically matched, because at the point of intersection both layers 46 and 48 are comprised of the same material, carbon. Similarly, the lattice structures of the wafer layer 50 and the transition layer 48 at the point of intersection are closely, if not identically matched, because at the point of intersection both layers 48 and 50 are comprised of the same material, silicon. This close matching of the lattice structure reduces sharp interfaces between the layers. Additionally, the thermal coefficients of expansion of the diamond layer 46 and the transition layer 48 at the point of intersection and the wafer layer 50 and the transition layer 48, are also closely matched be, cause of the similar composition of the materials. These factors minimize the chance of layers delaminating or cracking. Overall composite wafer film stresses resulting from the mismatched thermal coefficients of expansion between the layers are also minimized due to the compositional gradient in the transition layer. This compositional gradient produces a layer with a thermal coefficient of expansion between the diamond layer 46 and the wafer layer 50, helping to reduce the chance of wafer warpage and wafer bow at elevated processing temperatures of other layers. Another advantage is that the method can be undertaken in one continuous process flow involving the diamond deposition, followed in-situ by the transition layer deposition, followed immediately by the bonding of the composite wafer to the handle wafer. This eliminates the need for multiple processes which add to the manufacturing costs often associated with prior methods.

Figure 4A:
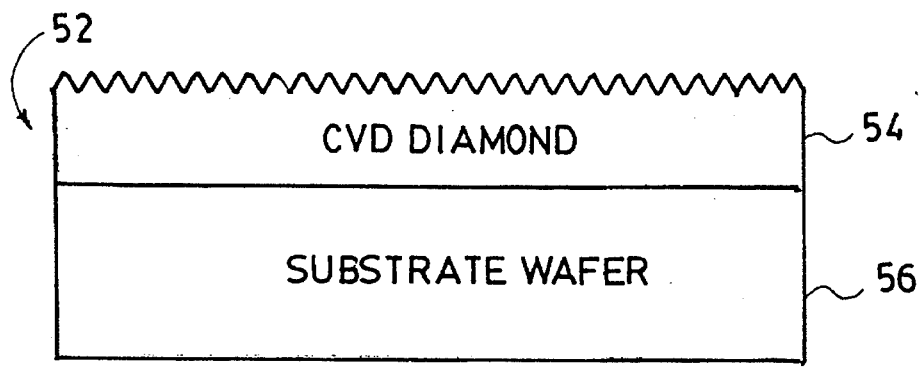
FIG. 4(a) is a schematic diagram of a composite wafer during a first step of a second method in accordance with the present invention, which uses two transition layers.
Figure 4B:
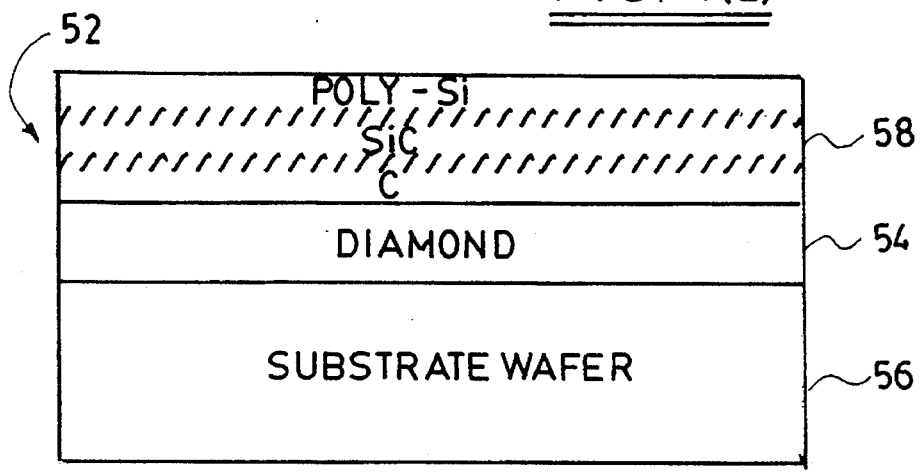
FIG. 4(b) is a schematic diagram of the composite wafer during a second step of the second method.

Referring to FIGS. 4(a)–4(g), a second embodiment of a method and resulting apparatus according to the present invention that has two transition layers. A first transition layer 58 is used to secure the diamond coated substrate 52 to a handle wafer 60; the second transition layer 62 secures a device wafer 64 to the diamond layer 54. The method begins with a composite wafer 52 having a layer of CVD diamond 54 deposited on a substrate wafer layer 56, as shown in FIG. 4(a). Although a CVD diamond layer 54 is shown, other layers could be deposited on the substrate wafer layer 56, such as germanium. Once the diamond layer 54 is deposited, a first transition layer 58 is deposited on the diamond layer 54, as shown in FIG. 4(b). The transition layer 58 has been previously described with respect to FIG. 3(a)–3(c) and will not be described here again.

Figure 4C:
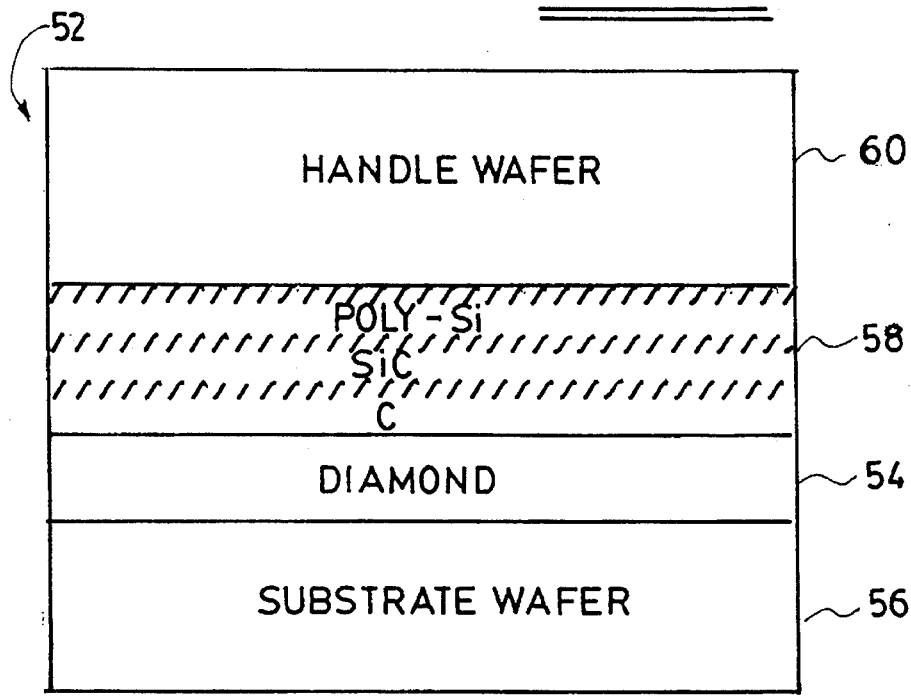
FIG. 4(c) is a schematic diagram of the composite wafer during a third step of the second method.
Figure 4D:
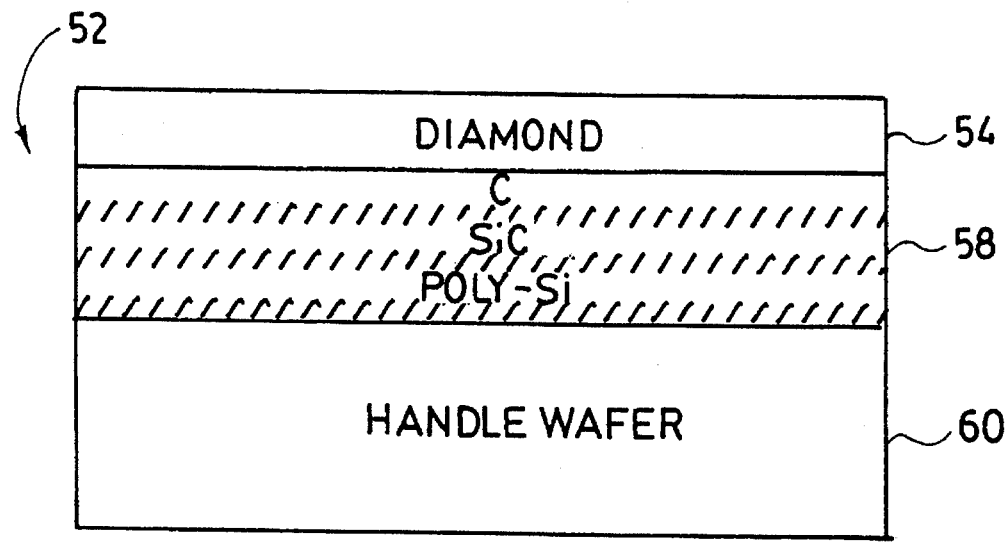
FIG. 4(d) is a schematic diagram of the composite wafer during a fourth step of the second method.

The next step in the method involves bonding or depositing a handle wafer layer 60 on the transition layer 58, as shown in FIG. 4(c). In this particular embodiment, the handle wafer layer 60 is comprised primarily of silicon, although the handle wafer layer 60 could be comprised of other materials, such as germanium. The handle wafer may be deposited or joined by one of several well-known techniques, including the use of an intermediate oxide layer to bond the poly-silicon handle silicon wafer. Once the handle wafer layer 60 is deposited, the composite wafer 52 is flipped and the substrate wafer layer 56 is removed from the diamond layer 54, as shown in FIG. 4(d).

Figure 4E:
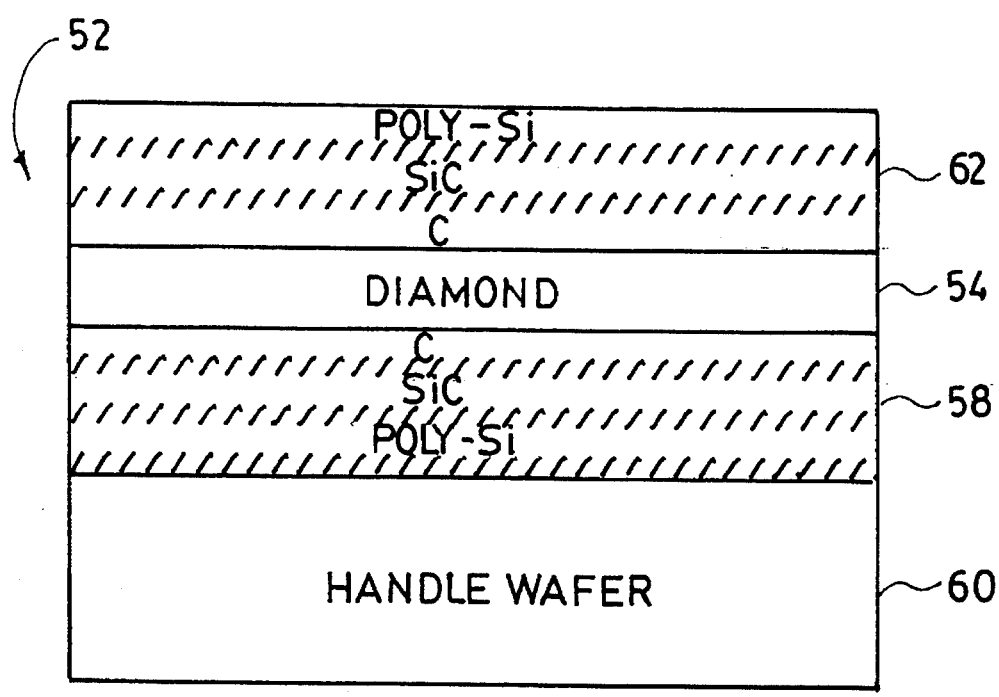
FIG. 4(e) is a schematic diagram of the composite wafer during a fifth step of the second method.

Next a second transition layer 62 is deposited on the diamond layer 54, as shown in FIG. 4(e). The transition layer 62 has been previously described with reference to FIGS. 3(a)–3(c) and will not be described here again.

Figure 4F:
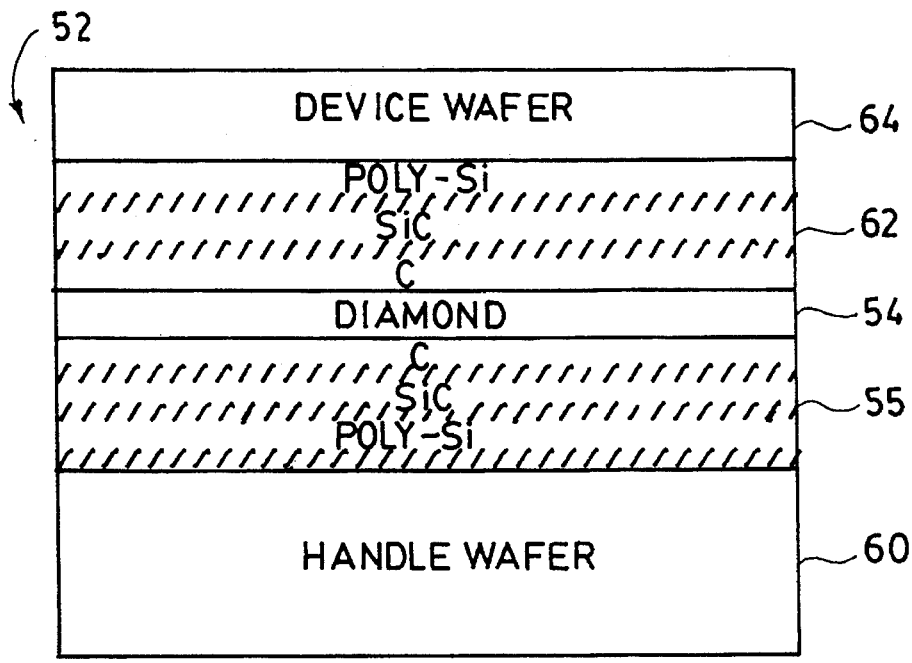
FIG. 4(f) is a schematic diagram of the composite wafer during a sixth step of the second method.
Figure 4G:
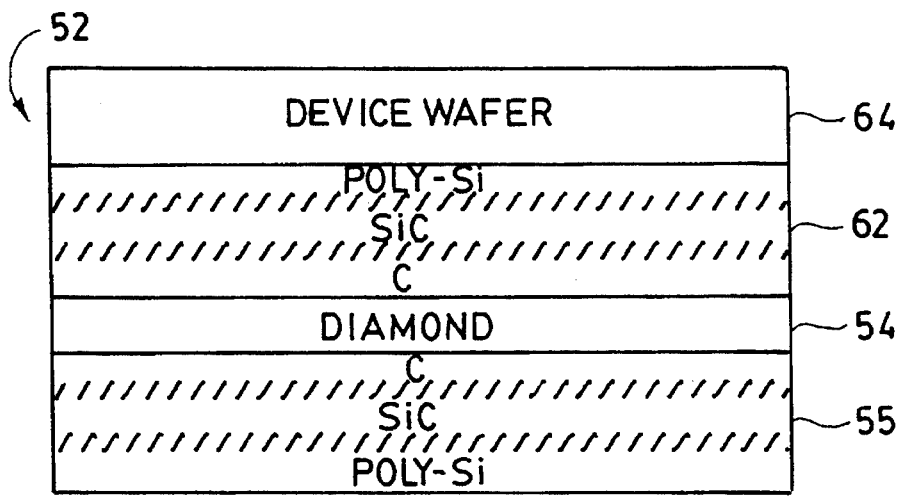
FIG. 4(g) is a schematic diagram of the composite wafer during a seventh step of the second method.

Once the second transition layer 62 is deposited, a device wafer layer 64 is bonded or deposited on the second transition layer 62, as shown in FIG. 4(f). Finally, as shown in FIG. 4(g), the handle wafer layer 60 is removed from the first transition layer 58 on the composite wafer 52. In addition to the previously-noted advantages described with respect to FIGS. 3(a)–3(c), which will not be repeated again here, the method described in FIGS. 4(a)–4(g) also protects the backside of the diamond layer 54 from ambient temperatures during high temperature processing involving other layers due to the remaining transition layer 58.

Figure 5A:
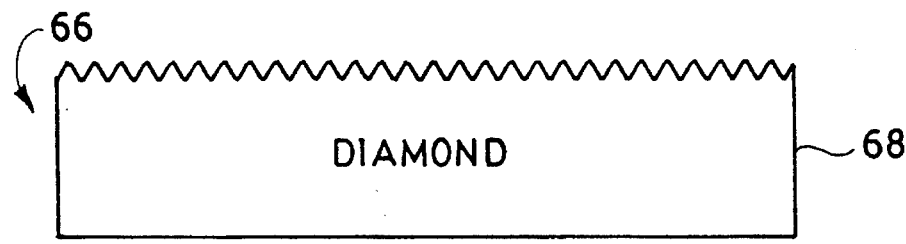
FIG. 5(a) is a schematic diagram of a composite wafer during a first step in a third method in accordance with the present invention, which uses two transition layers.
Figure 5B:
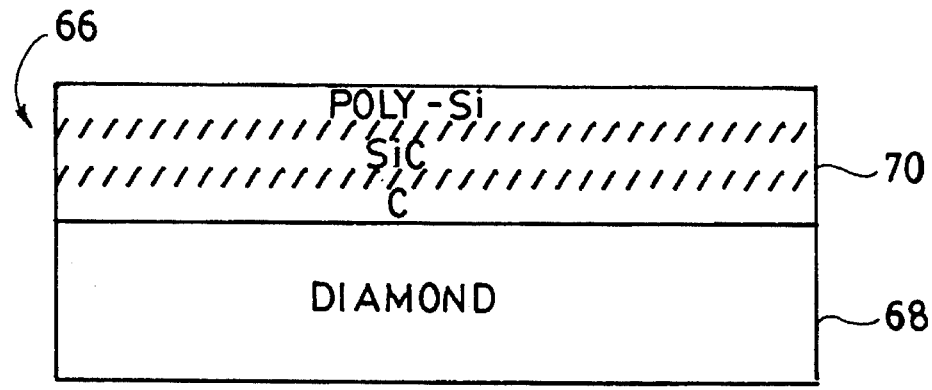
FIG. 5(b) is a schematic diagram of the composite wafer during a second step of the third method.

Referring to FIGS. 5(a)–5(f), a third embodiment of the method and resulting apparatus according to the present invention is shown. The method begins with a composite wafer 66 composed of a free standing diamond layer 68, as shown in FIG. 5(a), on which a first transition layer 70 is deposited, as shown in FIG. 5(b). Again, since the transition layer 70 was described with reference to FIGS. 3(a)–3(c), it will not be described here again.

Figure 5C:
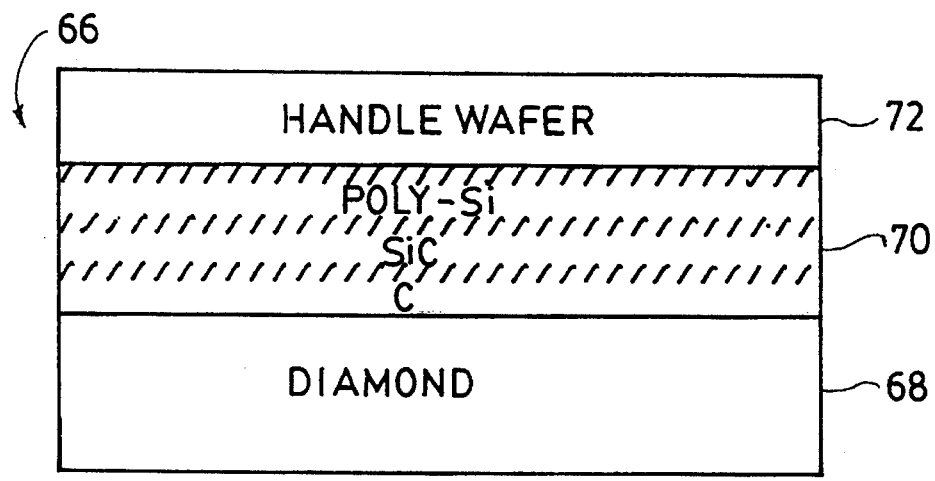
FIG. 5(c) is a schematic diagram of the composite wafer during a third step of the third method.
Figure 5D:
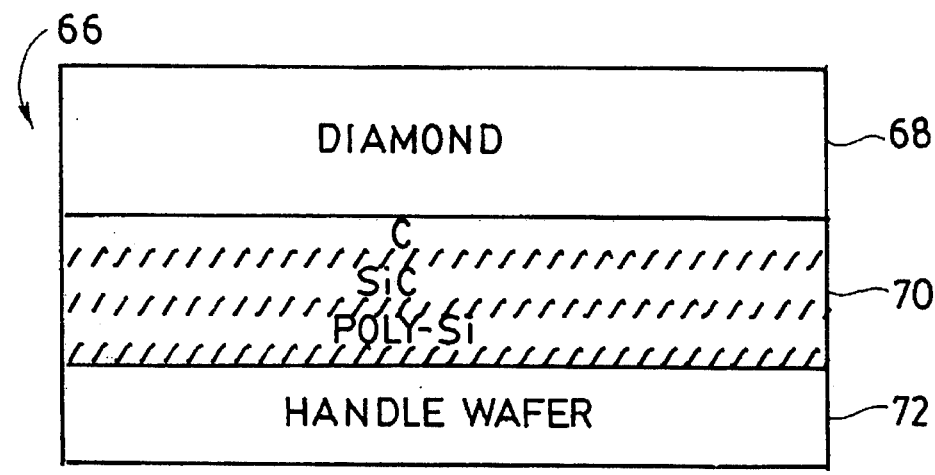
FIG. 5(d) is a schematic diagram of the composite wafer during a fourth step of the third method.
Figure 5E:
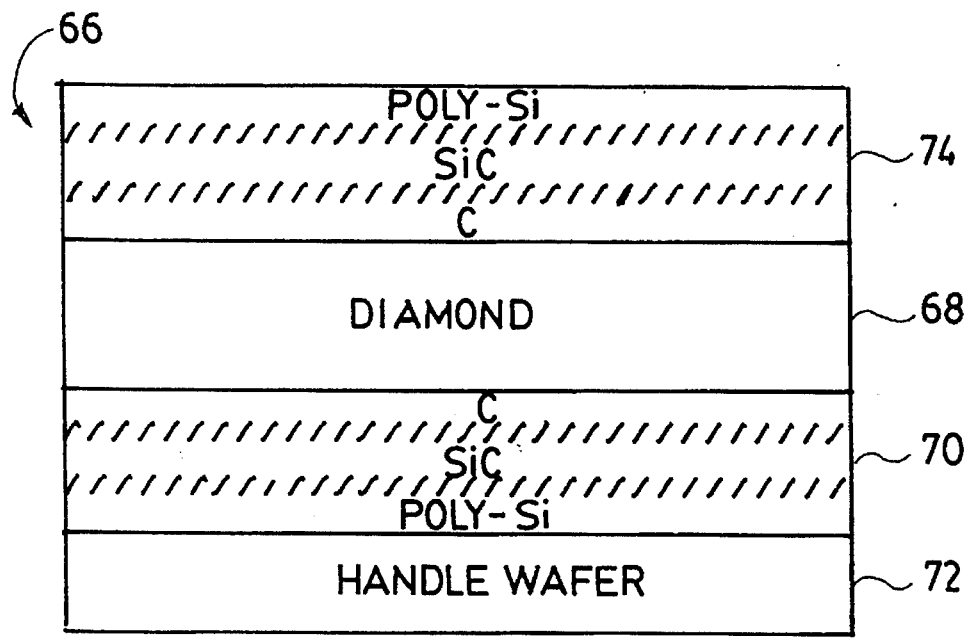
FIG. 5(e) is a schematic diagram of the composite wafer during a fifth step of the third method.
Figure 5F:
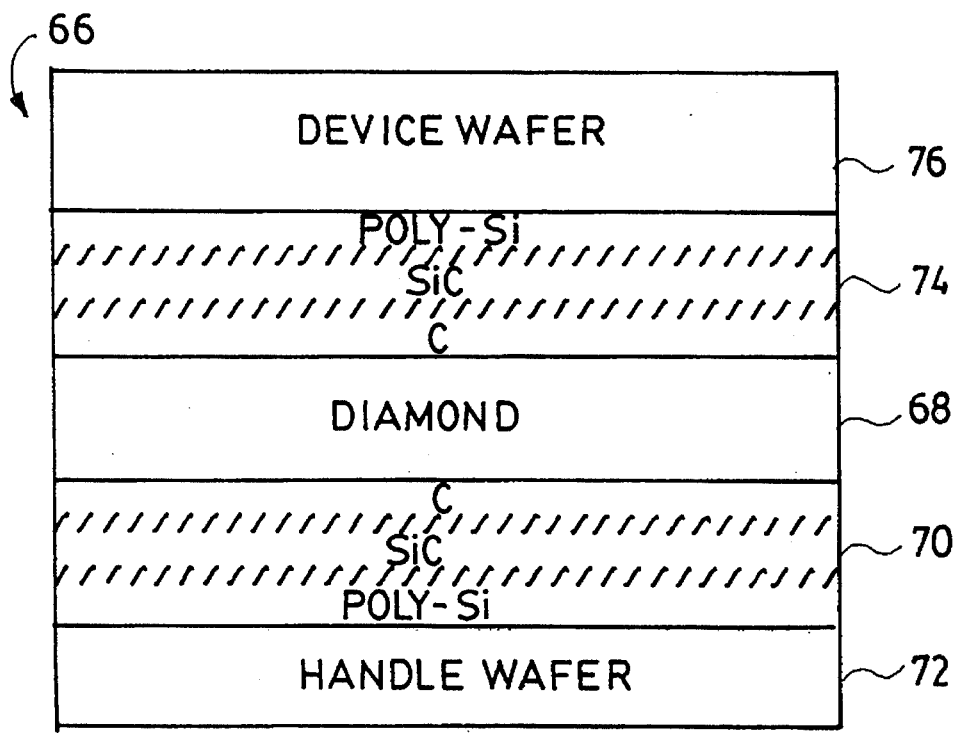
FIG. 5(f) is a schematic diagram of the composite wafer during a sixth step of the third method.

Once the first transition layer 70 has been deposited, a handle wafer layer is bonded or deposited on the first transition layer 70, as shown in FIG. 5(c). Next, the composite wafer 66 is flipped-over as shown in FIG. 5(d) and a second transition layer 74 is deposited on the diamond layer 68, as shown in FIG. 5(e). The transition layer 74 has been described with reference to FIGS. 3(a)–3(c) and will not be described here again. Once the second transition layer 74 is deposited, a device wafer layer 76 is bonded or deposited on the second transition layer 74, as shown in FIG. 5(f). This method has the same advantages previously described with respect to FIGS. 3(a)–3(c) and FIGS. 4(a)–4(g), which will not be repeated again here.

Having thus described the basic concept of the invention, it will be readily apparent to those skilled in the art that the foregoing detailed disclosure is intended to be presented by way of example only, and is not limiting. The invention thus provides a flexible, transition layer technique that can be used to join two or more substrates together where the substrates have joined surfaces of different materials. Various alterations, improvements and modification will occur and are intended to those skilled in the art though not expressly stated herein. These modifications, alterations, and improvements are intended to be suggested hereby, and are within the spirit and scope of the invention. Accordingly, the invention is limited only by the following claims and equivalents thereto.

What is claimed is:

1. An apparatus comprising:

a diamond layer on a substrate, said diamond layer comprising one or more first elements; and a first transition layer deposited on said diamond layer on an opposing side from said substrate; and a first wafer bonded to said first transition layer, said first wafer comprising one or more second elements, wherein said second element is a semiconductor material;

said first transition layer comprising said first and second elements and said portion of said first transition layer adjacent said diamond layer comprising substantially said one or more first elements and said portion of said of said first transition layer adjacent said second layer comprising substantially said one or more second elements.

2. The apparatus as set forth in claim 1 wherein said first element comprises carbon, said second element comprises silicon, and said first transition layer comprises carbon and silicon.

3. The apparatus as set forth in claim 2 wherein said first transition layer is between 500 and 40,000 angstroms thick.

4. The apparatus according to claim 1 wherein said substrate is removed further comprising:

a second transition layer deposited on the side of said diamond layer opposite said first transition layer; and a second wafer bonded to said second transition layer, said second wafer comprising one or more third elements;

said second transition layer comprising said one or more first and third elements and said portion of said second transition layer adjacent said diamond layer comprising substantially said first element and said portion of said second transition layer adjacent said second wafer comprising substantially said third element.

5. The apparatus according to claim 4 wherein the relative composition of said first and third elements in said second transition layer varies to reduce the amount of said first element and increase the amount of said third element in said second transition layer as the distance from said diamond layer increases and to reduce the amount of said third element and increase the amount of said first element in said second transition layer as the distance from said second wafer increases.

6. The apparatus according to claim 5 wherein said first element comprises carbon, said second element comprises silicon, said third element comprises silicon, said first transition layer comprises carbon and silicon, and said second transition layer comprises carbon and silicon.

7. An apparatus comprising:
- a diamond layer on a substrate, said diamond layer comprising carbon;
- a first transition layer deposited on said diamond layer; and
- a first wafer layer comprising silicon bonded to said first transition layer on an opposing side from said substrate; and
  - said first transition layer comprising carbon and a semiconductor material and having the amount of carbon in the composition of said first transition layer at a maximum at the surface adjacent said diamond layer and at a minimum at the surface adjacent said first wafer layer, while the amount of the semiconductor material in the composition of said first transition layer is at a maximum at the surface adjacent said first wafer layer and is at a minimum at the surface adjacent said diamond layer.

8. The apparatus according to claim 7 wherein the amount of carbon in the composition of said first transition layer is inversely proportional to the distance from said diamond layer and the amount of the semiconductor material in the composition of said first transition layer is inversely proportional to the distance from said first wafer layer.

9. The apparatus according to claim 8 wherein said first transition layer is between 500 and 40,000 angstroms thick.

10. The apparatus according to claim 7 wherein said substrate is removed further comprising:
- a second transition layer deposited on the side of said diamond layer opposite said first transition layer; and
- a second wafer layer comprising silicon bonded to said second transition layer;
  - said second transition layer comprising carbon and the semiconductor material and having the amount of carbon in the composition of said second transition layer at a maximum at the surface adjacent said diamond layer and at a minimum at the surface adjacent said second wafer layer, while the amount of the semiconductor material in the composition of said second transition layer is at a maximum at the surface adjacent said second wafer layer and is at a minimum at the surface adjacent said diamond layer.

11. The apparatus according to claim 10 wherein the relative composition of carbon and the semiconductor material in said second transition layer varies to reduce the amount of carbon and increase the amount of the semiconductor material in said second transition layer as the distance from said diamond layer increases and to reduce the amount of the semiconductor material and increase the amount of carbon in said second transition layer as the distance from said second wafer layer increases.

12. The apparatus according to claim 7 wherein the semiconductor material is silicon.

* * * * *